US011107812B2

(12) United States Patent
Chan et al.

(10) Patent No.: US 11,107,812 B2
(45) Date of Patent: Aug. 31, 2021

(54) METHOD OF FABRICATING STACKED SEMICONDUCTOR DEVICE

(71) Applicant: IMEC vzw, Leuven (BE)

(72) Inventors: Boon Teik Chan, Wilsele (BE); Zheng Tao, Heverlee (BE); Steven Demuynck, Aarschot (BE)

(73) Assignee: IMEC vzw, Leuven (BE)

( * ) Notice: Subject to any disclaimer, the term of this patent is extended or adjusted under 35 U.S.C. 154(b) by 3 days.

(21) Appl. No.: 16/696,935

(22) Filed: Nov. 26, 2019

(65) Prior Publication Data

US 2020/0168606 A1 May 28, 2020

(30) Foreign Application Priority Data

Nov. 27, 2018 (EP) .................................. 18208435

(51) Int. Cl.
*H01L 21/00* (2006.01)
*H01L 27/00* (2006.01)
(Continued)

(52) U.S. Cl.
CPC .... *H01L 27/0922* (2013.01); *H01L 21/02532* (2013.01); *H01L 21/02603* (2013.01); *H01L 21/308* (2013.01); *H01L 21/3065* (2013.01); *H01L 21/823807* (2013.01); *H01L 21/823814* (2013.01); *H01L 21/823828* (2013.01); *H01L 21/823871* (2013.01); *H01L 29/0673* (2013.01);
(Continued)

(58) Field of Classification Search
CPC ......... H01L 21/8221; H01L 21/823807; H01L 21/308; H01L 21/823871; H01L 21/823828; H01L 21/84; H01L 21/02603; H01L 21/3065; H01L 21/02532; H01L 21/823814; H01L 27/0922; H01L 27/0924; H01L 27/0886; H01L 27/1211; H01L 27/10826; H01L 29/66742; H01L 29/66545; H01L 29/66795; H01L 29/78696; H01L 29/41733; H01L 29/42392; H01L 29/78684; H01L 29/0673
See application file for complete search history.

(56) References Cited

U.S. PATENT DOCUMENTS 5,963,800 A 10/1999 Augusto
8,093,659 B2 1/2012 Nuttinck
(Continued)

OTHER PUBLICATIONS

European Search Report for Application No. EP 18208435.0, dated Jun. 24, 2019, which claims priority of Application No. 18208435.0.

*Primary Examiner* — Nikolay K Yushin
(74) *Attorney, Agent, or Firm* — Knobbe, Martens, Olson & Bear, LLP

(57) ABSTRACT

The disclosed technology relates to a method of forming a stacked semiconductor device. One aspect includes fin structures formed by upper and lower channel layers which are separated by an intermediate layer. After preliminary fun cuts are formed in the fin structure, a sacrificial spacer is formed that covers end surfaces of an upper channel layer portion. Final fin cuts are formed in the fin structure where the lower channel layer is etched which defines a lower channel layer portion. Lower source/drain regions are formed on end surfaces of the lower channel layer portion. The sacrificial spacer shields the end surfaces of the upper channel layer portion allowing for selective deposition of material for the lower source/drain regions.

18 Claims, 9 Drawing Sheets

(51) Int. Cl.
    *H01L 29/00*         (2006.01)
    *H01L 27/092*       (2006.01)
    *H01L 21/02*         (2006.01)
    *H01L 21/3065*      (2006.01)
    *H01L 21/308*       (2006.01)
    *H01L 21/8238*      (2006.01)
    *H01L 29/06*         (2006.01)
    *H01L 29/417*       (2006.01)
    *H01L 29/423*       (2006.01)
    *H01L 29/66*         (2006.01)
    *H01L 29/786*       (2006.01)

(52) U.S. Cl.
    CPC .. *H01L 29/41733* (2013.01); *H01L 29/42392* (2013.01); *H01L 29/66545* (2013.01); *H01L 29/66742* (2013.01); *H01L 29/78684* (2013.01); *H01L 29/78696* (2013.01)

(56) References Cited

U.S. PATENT DOCUMENTS

| | | |
|---|---|---|
| 9,627,270 B2 | 4/2017 | Cheng et al. |
| 9,837,414 B1 | 12/2017 | Balakrishnan et al. |
| 9,947,804 B1 | 4/2018 | Frougier et al. |
| 9,954,058 B1 | 4/2018 | Mochizuki et al. |
| 9,991,261 B2 | 6/2018 | Mitard |
| 10,090,193 B1 | 10/2018 | Chanemougame et al. |
| 10,134,640 B1 | 11/2018 | Chiang et al. |
| 2017/0250250 A1 | 8/2017 | Bentley et al. |
| 2018/0047832 A1 | 2/2018 | Tapily et al. |
| 2018/0114834 A1 | 4/2018 | Cheng et al. |

METHOD OF FABRICATING STACKED SEMICONDUCTOR DEVICE

CROSS-REFERENCE TO RELATED APPLICATIONS

This application claims foreign priority to European Application No. EP 18208435.0, filed Nov. 27, 2018, the content of which is incorporated by reference herein in its entirety.

BACKGROUND

Field

The disclosed technology generally relates to semiconductor devices, and more particularly to stacked semiconductor devices and methods of fabricating the same.

Description of the Related Technology

Consumers increasingly demand electronic products having semiconductor devices that are highly integrated for superior performance while remaining relatively inexpensive. Some of the consumer demands may be addressed with continued physical scaling of the semiconductor devices and increase in the density of the semiconductor devices. In some semiconductor devices, e.g., two-dimensional (2D) or planar semiconductor devices, the integration (density) of the device mainly corresponds to the lateral dimensions or the area occupied by a unit cell of the device. With continued scaling to achieve increasingly smaller devices, however, such lateral scaling may eventually become impractical or insufficient to meet the technological needs. This may be because, among other reasons, as the technological node advances, smaller sizes may be achieved at the expense of increasing difficulty and/or cost.

To enable more area and power efficient circuits, three-dimensional (3D) semiconductor devices having vertically arranged cells are receiving increasing attention as an alternative to traditional 2D or planar semiconductor devices. One notable example is stacked transistor devices including, for example, a complementary pair of field effect transistors (FETs) stacked on top of one another. A challenging step in an integration scheme for a stacked transistor pair is separating the source/drain regions of the lower and the upper transistor.

SUMMARY OF THE CERTAIN INVENTIVE ASPECTS

An objective of the present disclosed concept is to address the afore-mentioned challenge and provide a method enabling separate formation of source/drain regions on stacked lower and upper channel layers. Further and alternative objectives may be understood from the following.

According to an aspect of the present disclosed concept there is provided a method for forming a semiconductor device, the method including: forming a fin cut mask above a semiconductor fin structure extending horizontally along a substrate, the fin structure including lower and upper channel layers separated by an intermediate layer, the fin cut mask covers the fin structure in a channel region and exposes the fin structure in fin cut regions on opposite sides of the channel region; forming preliminary fin cuts in the fin structure by partially etching through the fin structure in the fin cut regions, the partial etching extends through the upper layer in the fin cut regions to define an upper channel layer portion in the channel region; forming a sacrificial spacer covering end surfaces of the upper channel layer portion which are exposed in the fin cut regions on opposite sides of the channel region; forming final fin cuts in the fin structure by further etching through the fin structure in the fin cut regions, the further etching extends into the lower layer in the fin cut regions to define a lower channel layer portion in the channel region; forming epitaxial lower source/drain regions on end surfaces of the lower channel layer portion which are exposed in the fin cut regions on opposite sides of the channel region; removing the sacrificial spacer, thereby exposing the end surfaces of the upper channel layer portion; forming epitaxial upper source/drain regions on the end surfaces of the upper channel layer portion.

The method enables a selective formation of a sacrificial spacer to cover upper channel layer portion end surfaces and expose lower channel layer portion end surfaces. Accordingly, lower source/drain regions may be formed on the lower channel layer portion end surfaces while the sacrificial spacer counteracts growth on the upper channel layer end surfaces. Subsequently, after removing the sacrificial spacer, upper source/drain regions may be formed on the upper layer end surfaces.

According to the method, a sacrificial spacer formation is integrated in the fin cut process, which also may be referred to as a fin recess process. More specifically, the fin cut process is partitioned into a preliminary fin cut formation stage and a final fin cut formation stage and the sacrificial spacer formation is performed between the preliminary and final stages of the fin cut formation. Hence, the sacrificial spacer may be formed selectively without involving additional fill material deposition and fill material etch back steps which could introduce non-uniformities in the final device structure.

Accordingly, the method enables formation of a vertical stack of transistors including a lower transistor and an upper transistor, the lower channel layer portion and the lower source/drain regions form part of the lower transistor and the upper channel layer and the upper source/drain regions form part of the upper transistor.

A semiconductor fin structure can include an elongated body extending along and protruding above the substrate and including a stack of the lower, intermediate and upper layers (or more). It should be noted that the labels "lower" and "upper" can be relative positions of the lower and upper layers, e.g., the "lower" layer being a layer formed closer to the substrate than the "upper" layer, as seen in a vertical direction/normal to the substrate. Accordingly, the lower layer need not be a bottom-most layer in the fin structure. Conversely the upper layer need not be a top-most layer of the fin structure.

The lower, intermediate and upper channel layers may each be formed by respective semiconductor layers. The intermediate layer may be formed by a semiconductor material different from the lower and upper channel layers. The lower and upper channel layers may be formed by a same or a different semiconductor material. The lower, intermediate and upper layer materials may each comprise Si and/or Ge wherein the intermediate layer material has a greater or lower Ge content than both the lower and upper layer materials. In other words, the lower channel layer material may be $Si_{1-x}Ge_x$, the intermediate layer material may be $Si_{1-y}Ge_y$ and the upper channel layer material may be $Si_{1-z}Ge_z$, wherein either y may be greater than x and z or smaller than x and z. In either case, x and z may be equal or different from each other.

A fin cut can include a cut, interruption, or gap extending across the fin structure such that a fin portion is formed on either side of the cut. A preliminary fin cut may be a cut extending downwardly through the fin structure to a preliminary cut level within the fin structure, above an intended final cut level. A final cut may be a cut extending downwardly through the fin structure to the intended final level.

Forming epitaxial (lower or upper) source/drain regions may include epitaxially growing protrusions of semiconductor material on the (lower or upper) channel layer portion end surfaces. The source/drain regions may be doped by in-situ doping (during the epitaxial growth). However, ion implantation (subsequent to the epitaxial growth) is also possible.

The method may further include covering the lower source/drain regions with a deposited material prior to forming the upper source/drain regions. As will be set out below, the deposited material may include a conductive material for lower source/drain contacts. However, the deposited material may also be a temporary material layer which may be removed subsequent to forming the upper source/drain regions.

The partial etching may be performed to extend completely through the upper channel layer and into the intermediate layer and be stopped at or prior to the lower channel layer. This allows forming the sacrificial spacer to cover the entire (vertical oriented) end surfaces of the upper channel layer. Moreover, by not etching into the lower channel layer, formation of exposed (vertically oriented) end surfaces of the lower channel layer may be avoided prior to sacrificial spacer layer formation. Hence, formation of the sacrificial spacer on end surfaces of the lower channel layer may be avoided.

The partial etching may be performed to extend only partially through the intermediate layer such that, in the fin cut regions, the lower channel layer remains covered by a thickness portion of the intermediate layer remaining in the fin cut regions. Thereby, an upper surface of the lower channel layer may be covered by the intermediate layer during the sacrificial layer formation, or as the case may be during recess formation which will be described below.

According to some embodiments where the partial etching is performed to extend into the intermediate layer, the partial etching may expose end surfaces of an intermediate channel layer portion in the fin cut regions on opposite sides of the channel region. Accordingly, the sacrificial spacer may be formed to further cover the (vertically oriented) end surfaces of the intermediate channel layer portion.

In a case where the partial etching is performed to extend only partially through the intermediate layer, the further etching may comprise etching through thickness portions of the intermediate layer remaining in the fin cut regions and into the lower channel layer.

According to some embodiments, the method may further include: subsequent to forming the preliminary fin cuts and prior to forming the sacrificial spacer, forming recesses in the fin structure between the upper channel layer portion and the lower channel layer on opposite sides of the channel region using an intermediate layer material selective etch, and depositing inner spacers in the recesses, where the sacrificial spacer is formed to cover the end surfaces of the upper channel layer portion and the inner spacers in the recesses.

Thus, the sacrificial spacer formation may be combined with recess and inner spacer formation. The inner spacers may thus cover the intermediate layer portions end surfaces prior to sacrificial spacer formation. Recess and inner spacer formation may ensure a sufficient insulation between gate and source/drain regions and/or contacts.

By the intermediate layer material selective etch, the intermediate layer material may be etched selectively to the lower and upper channel layer materials, to undercut the upper channel layer portions. By the etch, intermediate layer portions having end surfaces which are etched back (horizontally) in relation to the end surfaces of the upper channel layer portions may be defined.

A selective etching or removal of a feature "A", relative to a feature "B" can include etching or removing a feature A arranged adjacent to a feature B while preserving the feature B. Depending on a relative etch rate of the feature A and feature B, the preservation of the feature B following the etch process may be complete (in the sense that the feature B is not affected appreciably during the etch process) or at least partial (in the sense that the feature B remains at least to the extent that it may serve its intended function during subsequent process steps). A ratio of an etch rate of the material of feature A compared to an etch rate of the material of feature B may advantageously be 2:1 or higher, 10:1 or higher, or 40:1 or higher.

Depositing the inner spacers may include depositing an inner spacer layer covering the fin cut mask and the fin structure in the fin cut regions and filling the recesses and thereafter removing inner spacer layer portions outside of the recesses by etching the inner spacer layer. The recesses may allow the inner spacer layer portions deposited within the recesses to be preserved to cover the intermediate layer portion end surfaces following the etching of the inner spacer layer.

Forming the sacrificial spacer may include: depositing a conformal sacrificial spacer layer to cover the fin structure and the fin cut mask, etching the sacrificial spacer layer using an anisotropic vertical etch such that sacrificial spacer layer portions on horizontally oriented surfaces are removed and sacrificial layer portions on vertically oriented surfaces remain to form the sacrificial spacer.

The vertically oriented surface can include sidewall surfaces of the fin cut mask. By depositing the conformal sacrificial spacer layer subsequent to the preliminary fin cut formation, the vertically oriented surfaces may include the end surfaces of the upper channel layer portion. By depositing the conformal sacrificial spacer layer prior to the final fin cut formation there may be no vertically oriented lower channel layer portion end surfaces exposed in the fin cut regions.

The fin cut mask may include a plurality of mask portions, each extending across the fin structure in a respective channel region and exposing fin cut regions on opposite sides of the respective channel region, the method may include forming a plurality of preliminary fin cuts by partially etching through the fin structure in each of the fin cut regions exposed by the fin cut mask.

Accordingly, the fin structure may be covered by the fin cut mask in a plurality of channel regions and exposed in a plurality of fin cut regions, the channel regions and fin cut regions may be alternatingly disposed along the fin structure. Lower and upper channel layer portions may accordingly be defined in each one of a plurality of channel regions along the originally fin structure. The sacrificial spacer formation may be formed on the upper layer channel portion end surfaces within each fin cut region. Epitaxial lower and upper source/drain regions may accordingly be formed on the lower and upper layer channel portion end surfaces, respectively, within each fin cut region.

The fin cut mask may include one or more dummy or sacrificial gate structures extending across the fin structure in a respective channel region.

Accordingly, subsequent to forming the lower and upper source/drain regions, the dummy or sacrificial gate structure may be replaced with a replacement metal gate structure.

The method may further include, subsequent to removing the dummy or sacrificial gate structure, removing the intermediate layer from the channel region using an intermediate layer material selective etch and thereafter forming the replacement metal gate structure.

Thereby, the circumferentially extending peripheral surface of the (or each in case of plural) upper channel layer portion may be exposed. In other words, the upper channel layer portion may be "released". This may allow the replacement metal gate structure to be formed to wrap-around the upper channel layer, e.g., a forming a gate-all-around (GAA). The intermediate layer may accordingly form a sacrificial layer of the layer stack.

The method may further include forming in the fin cut regions lower source/drain contacts for the lower source/drain regions and upper source/drain contacts for the upper source/drain regions. The lower source/drain contacts may be formed prior to removing the sacrificial spacer. Thereby, the sacrificial spacer may cover the upper layer portion end surfaces during the lower source/drain contact formation.

In at least one of the fin cut regions, the lower and the upper source/drain contact may be formed to be vertically separated by an insulator. Thus, a lower source/drain contact may be insulated from an above upper source/drain contact. The insulator may be formed by an insulating capping layer. The insulating capping layer may be formed on at least one of the lower source/drain contacts, at least one of the upper source source/drain contacts may be formed on the insulating capping layer.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

The present disclosure relates to a method for forming a semiconductor device. The semiconductor device may be formed from a layer stack including lower and upper channel layers and an intermediate layer. A fin cut mask is formed above the fin structure to cover the fin structure in one or more channel regions and expose the fin structure in fin cut regions on opposite sides of each channel region. Preliminary fin cuts are formed by partially etching through fin structure in the fin cut regions, thereby defining an upper channel layer portion in each channel region. A sacrificial spacer is subsequently formed on upper channel layer portion end surfaces exposed in/facing the fin cut regions. Final fin cuts are then formed by further etching through the fin structure in the fin cut regions, thereby defining a lower channel layer portion in each channel region. Epitaxial lower source/drain regions may then be formed on lower channel layer portion end surfaces exposed in/facing the fin cut regions. Following removal of the sacrificial spacer, epitaxial upper source/drain regions may be formed on exposed end surfaces of the upper channel layer. The method may then proceed by forming a vertical stack of transistors including a lower transistor such as a lower FET and an upper transistor such as an upper FET by forming source/drain contacts and forming a conductive gate structure in each channel region. Gate structure formation may be preceded by removing the fin cut mask and removing intermediate layer portions remaining in the channel regions.

A detailed description of a method will now be given with reference to FIGS. 1-16. It should be noted that in the figures, the relative dimensions of the shown elements, in particular the relative thickness of the layers, is merely schematic and may, for the purpose of illustrational clarity, differ from a physical structure. The method will be described in conjunction with a replacement metal gate (RMG) flow where the fin cut mask comprises one or more dummy or sacrificial gate structures, to cover the one or more fin structures in the channel regions and expose the one or more fin structures in the fin cut regions. However, it should be noted that the method has a more general applicability and may be used with any type of fin cut mask.

Figure 1:
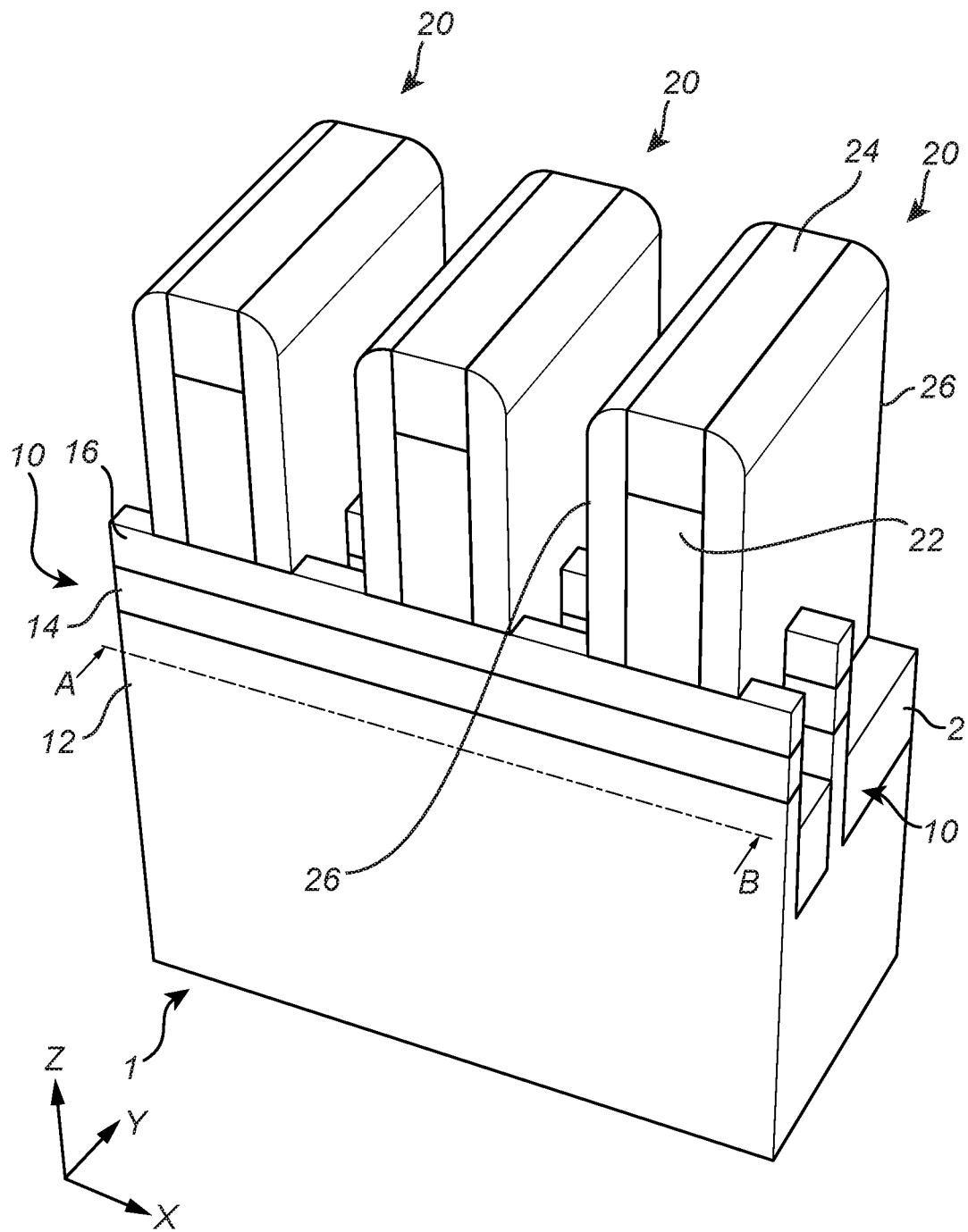
FIGS. 1-16 schematically illustrate a method for forming a semiconductor device.
Figure 2:
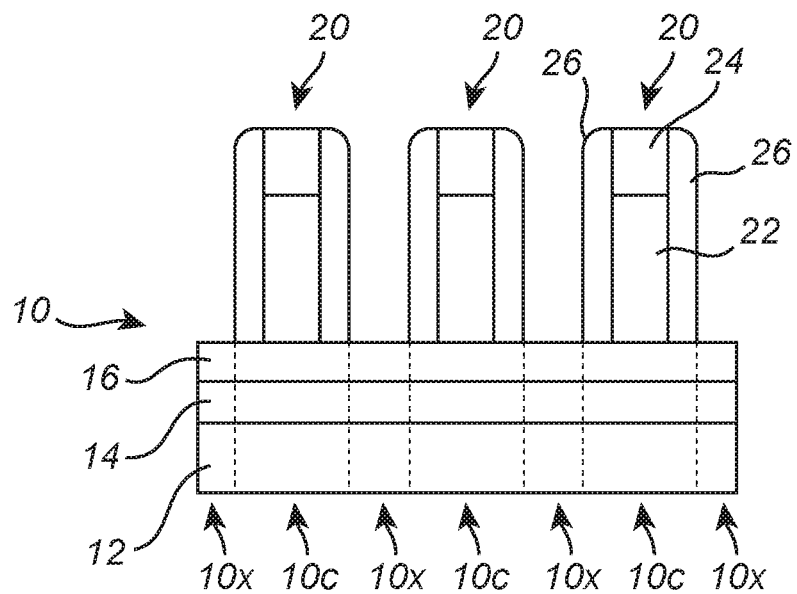

FIGS. 1 and 2 illustrate a section of an initial or intermediate semiconductor structure comprising a number of fin structures 10 formed on a substrate 1. The structure may extend laterally or horizontally beyond the illustrated section. In the figures, X, Y and Z represent orthogonal directions, namely a first horizontal direction X, a second horizontal direction Y and a vertical direction Z. X and Y extend along the main plane of extension of the substrate 1. Z extends in parallel to a normal direction to the substrate 1. The front plane of section A-B is taken to extend through and along the longitudinal direction of a fin 10. FIG. 2 and onwards represent a plan view or side view of the front plane along section A-B.

In FIG. 1, two fin structures 10 are shown however this is merely an example and there may in principle be any number of fin structures. Each fin structure 10 protrudes above the substrate 1 along the vertical direction Z. Each fin structure 10 may be an elongated semiconductor body extending in parallel to the horizontal direction X. Each fin structure 10 may extend along a respective "fin track". In the following reference will be made mainly to the fin structure 10 coinciding with the front plane of section. However, the following description may apply correspondingly to any further fin structure present on the substrate 1.

The substrate 1 may be any conventional substrate 1, such as a substrate suitable for complementary metal-oxide semiconductor (CMOS) processing. The substrate 1 may for instance be a semiconductor substrate such as a Si substrate, a germanium (Ge) substrate or a silicon-germanium (SiGe) substrate. Other examples include a semiconductor-on-insulator (SOI) type of substrate such as a Si-on-insulator substrate, a Ge-on-insulator substrate or a SiGe-on-insulator substrate.

The fin structure 10 comprises a layer stack comprising a lower channel layer 12, an intermediate layer 14 and an upper channel layer 16. As indicated in the figures, the lower channel layer 12 need not form a separate layer on top of the substrate 1. Rather the lower layer 4 may be formed by an upper thickness portion of a semiconductor layer of the substrate 1. However, the lower layer 12 may also be formed by an individual semiconductor layer on the substrate 1, or by the semiconductor layer of a SOI-type of substrate.

The lower channel layer 14 and the upper channel layers 18 may be formed of Si and/or Ge including a semiconductor layer of either a same or a different composition. The intermediate layer 16 may be formed of a Si and/or Ge including a semiconductor layer of a different composition than the lower and upper channel layers 12, 16. The lower channel layer 12, the intermediate layer 14 and the upper channel layer 16 may be formed by $Si_{1-x}Ge_x$, $Si_{1-y}Ge_y$, and $Si_{1-z}Ge_z$, respectively, where the subscripts are given by x, y, z≥0, y≠x, y, and either x=z or x≠z. For example, the lower and upper channel layers 12, 16 may be SiGe-layers and the intermediate layer may be a Si-layer. Alternatively, the lower and upper channel layers 12, 16 may be Si-layers and the intermediate layer may be a SiGe-layer or Ge-layer. The intermediate layer 14 may include a Ge-content which differs by at least 10 percentage units from a Ge-content of the lower and upper channel layers 12, 16.

The separation between the fin structures 10 may be on the order of tens of nanometers. The fin structures 10 may be formed using a fin-formation technique. For example, fin-formation may include patterning a plurality of parallel fins in an epitaxial layer stack by etching trenches in the epitaxial layer stack. The epitaxial layer stack may include a lower epitaxial layer, an intermediate epitaxial layer and an upper epitaxial layer. Either single- or multiple-patterning techniques may be employed, e.g., self-aligned double patterning (SADP) or quadruple patterning (SAQP).

With continued reference to FIG. 1, the substrate 1 is covered by an insulating layer 2. The insulating layer 2 embeds a lower part of the fin structures 10. The insulating layer 2 may be formed as a shallow trench isolation (STI) by depositing an insulating layer in trenches on opposite sides of each fin structure 10. The insulating layer may include an oxide layer such as $SiO_2$ or some other low-k dielectric. The fin structures 10 may be formed with a height of 10-100 nm above the insulating layer 2.

Also shown in FIGS. 1 and 2, a set of dummy or sacrificial gate structures 20 have been formed to extend across the fin structures 10. Each dummy gate structure 20 may extend along a respective "gate track" extending along the second horizontal direction Y, perpendicular to the fin tracks. The figures show three dummy gate structures 20, however, one of ordinary skill in the art would appreciate that the dummy gate structure can include one or more gate structures 20 formed across the fin structures 10. A dummy gate structure 20 may serve as a place-holder for a final gate structure, e.g., a replacement gate (RMG) structure, and may also be used for the purpose of defining fin cut regions along the fin structures 10. Hence, the one or more dummy gate structures 20 may also be said to form part of or define a fin cut mask 20. Accordingly, each dummy gate structure 20 may form a respective fin cut mask portion and extend across and thus cover or mask a fin structure 10 in a respective channel region 10c and expose the fin structure 10 in fin cut regions 10x on opposite sides of each channel region 10c, e.g., on opposite sides of each dummy gate structure 20. Thus, a fin cut mask 20 comprising more than one mask portion/dummy gate structure 20 may define an alternating sequence of channel regions 10c and fin cut regions 10x along the length of each fin structure 10.

A dummy or sacrificial gate structure 20 may, as shown, include a dummy gate 22 of a dummy material such as polysilicon or amorphous silicon. A pair of gate spacers 26 may be formed on opposite sides of each dummy gate 22, e.g., on opposite sidewalls of the dummy gate 22. The gate spacers may for instance be formed by an oxide- or nitride-material such as $SiO_2$, SiN, SiOC or SiOCN, to name a few non-limiting examples. Although omitted from the figures for purpose of illustrational clarity, each gate structure 20 may comprise a dummy dielectric formed between the fin structure 10 and the dummy gate 22. The dummy dielectric may for instance be an oxide such as $SiO_2$, conformally deposited to cover the fin structures 10. Further, each gate structure 20 may include a respective gate cap 24 covering/capping an upper surface of the dummy gate 22. The gate caps may for instance be formed by SiN or some other hard mask material.

The dummy or sacrificial gates 22 may be formed by depositing a dummy gate material layer to cover the one or more fin structures 10. The dummy gate material may for instance be chemical vapor deposition (CVD) deposited polysilicon or amorphous silicon. The dummy gate material layer deposition may be preceded by a thermal or an atomic layer deposition (ALD) of a dummy dielectric layer. Dummy gates 22 may thereafter be formed by patterning the dummy gate material layer by etching trenches in the dummy gate layer, the trenches extending in a direction across the one or more fin structures 10, e.g., along the second horizontal direction Y. Dummy gate patterning may include depositing and patterning a hard mask layer above the dummy gate layer using either single- or multiple-patterning techniques. The dummy gate layer may thereafter be etched using the patterned hard mask layer as an etch mask. For instance, a fluorine- or chloride-based wet-etch process or a dry-etch process such as reactive ion etching (ME) may be used. Hard mask layer portions on the patterned dummy gates 22 may be preserved to form the gate caps 24 on the upper surface of the dummy gates 22. Gate spacers 26 may subsequently be formed through conformal spacer layer deposition (e.g., by ALD) followed by a vertical anisotropic etch such that spacer layer portions covering horizontal surfaces are removed while spacer layer portions covering vertical surfaces remain following the etch.

The one or more gate structures 20 may be embedded in an interlayer dielectric (ILD) layer (e.g., of $SiO_2$ or some other conventional a low-k dielectric) having an upper surface flush with an upper surface of the gate structures (e.g., formed by an upper surface of a gate cap 24). The ILD material may be deposited by CVD, planarized (e.g., by chemical mechanical polishing, CMP) and/or etched back such that upper surfaces of the gate structures 20 are exposed.

Figure 3:
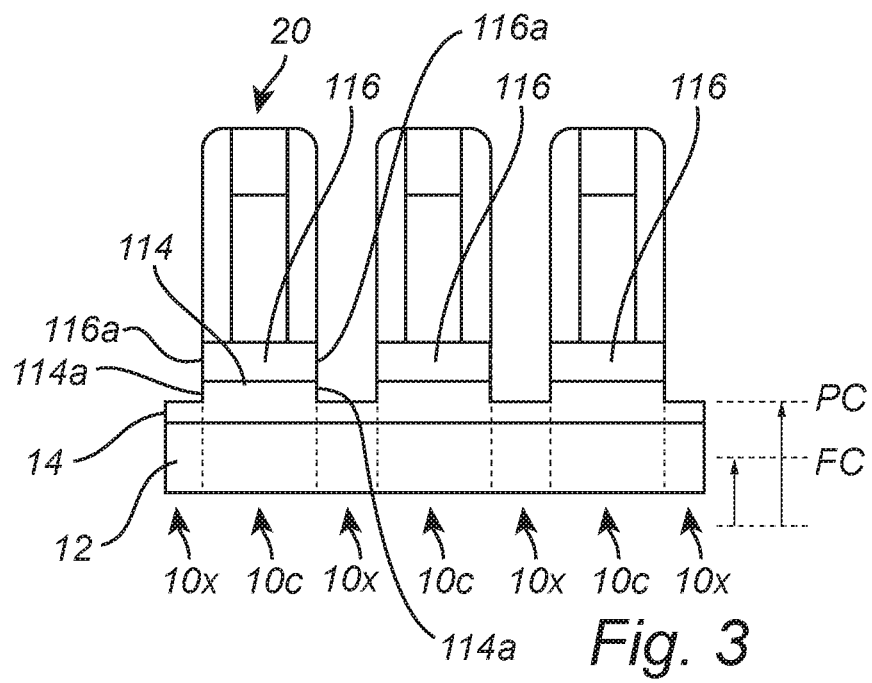

With reference to FIG. 3, a number of preliminary fin cuts or preliminary recesses have been formed in the fin structure 10. The preliminary fin cuts have been formed by partially etching through the fin structure 10 in the fin cut regions 10x while using the fin cut mask/the dummy gate structures 20 as an etch mask. The partial etching, and thus each preliminary fin cut, extends partially through the height of the fin structure 10, in a top-down direction. Thus the partial etching/preliminary fin cuts extend/extends from a top part of the fin structure 10 to a preliminary vertical cut level "PC" above an intended final vertical cut level "FC"). The cut levels PC/FC may be defined as respective levels above an upper surface of the substrate 1, or correspondingly the insulating layer 2. The partial etching may, as shown in FIG. 3, at least extend completely through the upper channel layer 16. The partial etching may then be stopped at any level between the level of an interface between the upper channel layer 16 and the intermediate layer 14 and the level of an interface between the intermediate layer 14 and the lower channel layer 12. The preliminary cut level PC may coincide with the upper/intermediate layer 16/14 interface, coincide with the intermediate/lower layer 14/12, or lie within the thickness of the intermediate layer 14. In the latter case, the lower channel layer 12 may remain covered in the fin cut regions 10x, by a thickness portion of the intermediate layer 14 remaining in the fin cut regions 10x. The depth of the partial etching, and correspondingly the preliminary cut level PC, may be controlled for instance by appropriately timing the etching.

The fin etching may include a dry etch, such as a reactive ion etch (ME). Example etching chemistries include a plasma etch with $HBr/O_2$, a $C_4F_8$ or $CF_4/CH_3$.

After forming the preliminary fin cuts the (preliminary cut/recessed) fin structure 10 includes a lower continuous (un-cut) fin part (disposed below the preliminary cut level PC) and a number of upper discontinuous (cut) fin parts (disposed above the preliminary cut level PC). The upper fin parts are disposed in the channel regions 10c and are separated by cuts or gaps in the fin cut portions 10x. As shown, each upper fin part may include a respective upper channel layer portion 116. Each upper channel layer portion 116 is formed by a portion of the upper channel layer 16 remaining in the channel region 10c following the partial etching. Each upper channel layer portion 116 presents a pair of vertically oriented end surfaces 116a, disposed on opposite sides of the respective channel region 10c. The end surfaces 116a of each upper channel layer portion 116 are formed by the partial etching. The end surfaces 116 are exposed in/face a respective cut region 10x.

As further shown, provided the partial etching is extended into the intermediate layer 14, each upper fin part may further include a respective intermediate layer portion 114. Each intermediate layer portion 114 may present a pair of vertically oriented end surfaces 114a, disposed on opposite sides of the respective channel region 10c. The end surfaces 114a are formed by the partial etching. The end surfaces 114a are thus exposed in/face a respective cut region 10x. If the partial etching is stopped within the intermediate layer 14, the intermediate layer portions 114 may be formed on a common continuous lower thickness portion of the intermediate layer 14 remaining under preliminary cut level PC, as shown in FIG. 3. However, if the partial etching extends completely through the intermediate layer 14, intermediate layer portions may be completely removed in the fin cut regions 10x.

Figure 4:
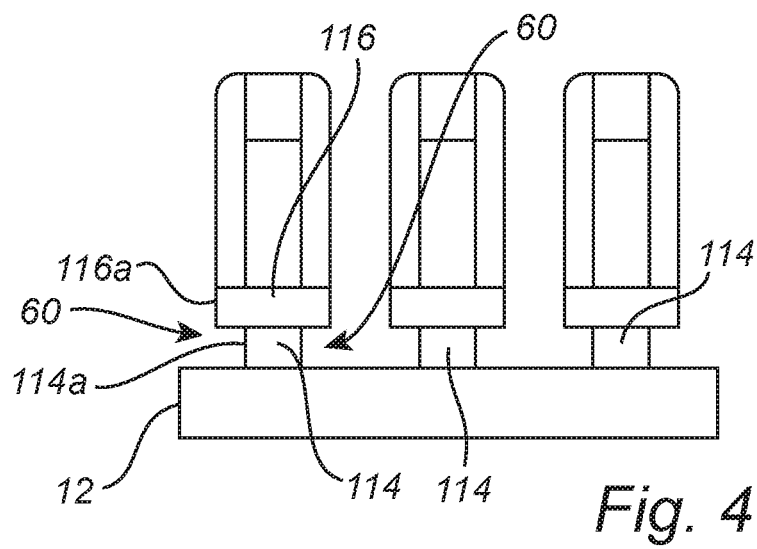

FIGS. 4-7 illustrate various stages of formation of an inner spacer 28 on end surfaces 114a of the intermediate layer portions 114. In FIG. 4, after forming the preliminary fin cuts, the method proceeds by forming cavities or recesses 60 in the fin structure 10, between the upper channel layer portion 116 and the lower channel layer 12, on opposite sides of each channel region 10c. The recesses 60 are formed by etching the intermediate layer material selectively to the lower and upper channel layer materials, thereby undercutting the upper channel layer portions 116. Accordingly, intermediate layer portions 114 having end surfaces 114a which are etched back (horizontally) in relation to the end surfaces 116a of the upper channel layer portions 116 may be defined. The upper channel layer portions 116 may form an overhang with respect to the recesses 60 at opposite sides of the respective channel regions 10c. The recesses 60 may for instance be formed with a (horizontal) depth in the range of 5-10 nm. The etch may be an etch providing at least a horizontal etching component, e.g., a non-zero horizontal etch rate of the intermediate layer material. Either wet or dry etching chemistries may be used. For instance, an HCl-based vapor etch may be used. Subsequent to recess formation, an inner spacer may be formed in the recesses 60 to cover the end surfaces 114a of the intermediate layer portions 114.

Figure 5:
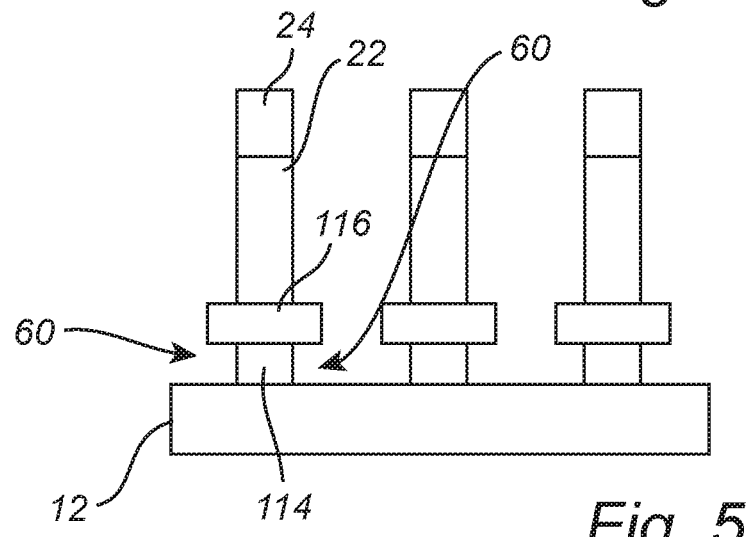

With reference to FIG. 5, inner spacer formation may comprise first removing the gate spacers 26 from the dummy gates 22. The gate spacers 26 may be removed using an oxide or dielectric etch, as appropriate.

Figure 6:
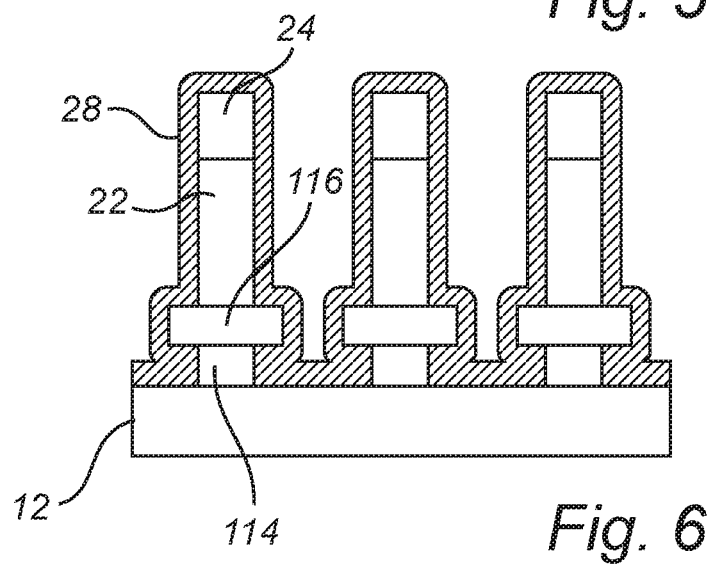
Figure 7:
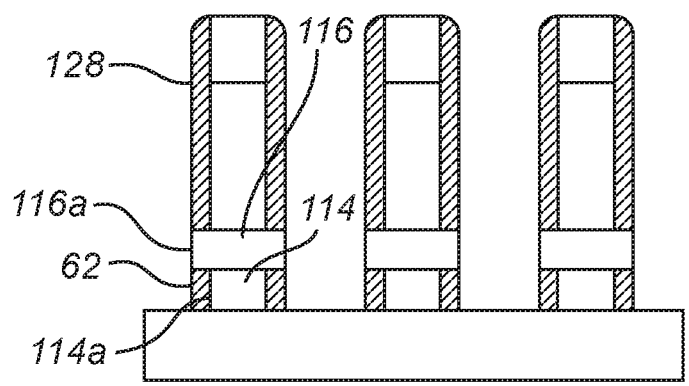

Subsequently, as shown in FIG. 6, a spacer layer 28 may be deposited to cover the sidewalls of the dummy gates 22 and the fin structure 10 and fill the recesses 60. The spacer layer 28 may be formed through conformal layer deposition (e.g., by ALD). The spacer layer 28 may be formed of any of the materials mentioned in connection with the gate spacer 26. With reference to FIG. 7, the spacer layer 28 may be subjected to a vertical anisotropic etch such that spacer layer portions covering horizontal surfaces are removed while spacer layer portions covering vertical surfaces remain following the etch. Thereby, the spacer layer portions remaining in the recesses 60 may form inner spacers 62 covering the end surfaces 114a of the intermediate layer portions 114. Meanwhile, the spacer layer portions covering the sidewalls of the dummy gates 22 may form a re-deposited/second gate spacer 128.

Alternatively, inner spacers 62 may be formed without a preceding removal of the gate spacers 26. An inner spacer layer covering the sidewalls of the gate spacers 26 and the fin structure 10 and filling the recesses 60 may be deposited. The inner spacer layer may for instance be an oxide layer such as $SiO_2$ or a nitride-layer such as SiN. The spacer layer may be conformally deposited using ALD. The spacer layer may subsequently be etched to remove inner spacer layer portions outside of the recesses 60, comprising inner spacer layer portions on the sidewalls of the gate spacers 26 and the sidewall portions of the fin structure 10 outside of the recesses 60. Either an isotropic or a vertical anisotropic oxide, nitride or dielectric etch may be employed. The recesses 60 can allow inner spacer layer portions deposited therein to be preserved on the intermediate layer end surfaces 114a.

Figure 8:
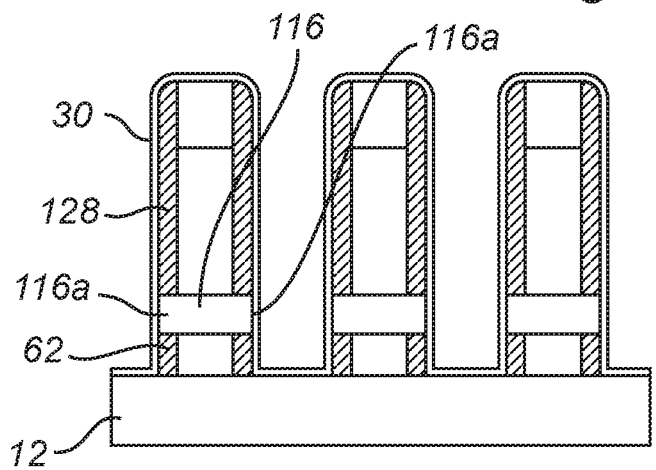
Figure 9:
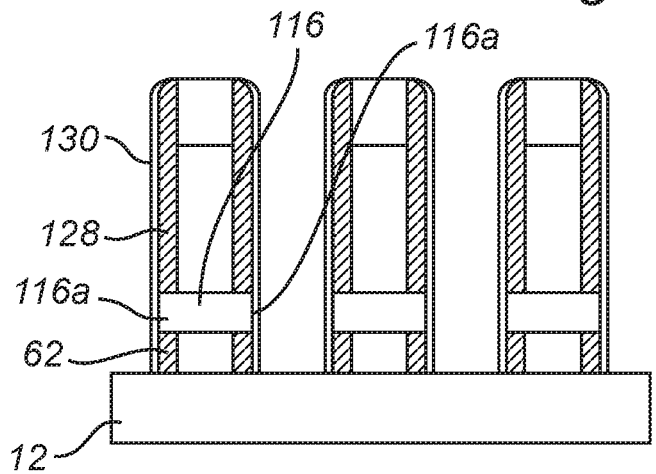

FIGS. 8-9 illustrate formation of a sacrificial spacer 130. The sacrificial spacer 130 covers the end surfaces 116a of the upper channel layer portions 116 exposed in the fin cut regions 10x on opposite sides of the channel region 10c. The sacrificial spacer 130 may more generally cover any vertically oriented end surfaces of the partially cut fin structure 10 exposed in the cut regions 10c and formed during the partial etching, e.g., the vertically oriented end surfaces of the upper fin parts exposed in the fin cut regions 10x. Thus, the sacrificial spacer 130 may also cover the vertically oriented end surfaces 114a of each intermediate channel layer portion 114. The vertically oriented surfaces may further comprise sidewall surfaces of the dummy gate structures 20. The vertically oriented surfaces may further comprise the inner spacers 62 (more specifically the exposed sidewall surfaces thereof). The sacrificial spacer 130 is formed to expose horizontally oriented surfaces of the structure. The horizontally oriented surfaces may comprise upper surfaces of the partially cut fin structure 10 in the fin cut regions 10x. The horizontally oriented surfaces may further comprise the upper surfaces of the dummy gate structures 20.

The sacrificial spacer 130 may be formed with a thickness in the range of 1-10 nm, preferably in the range of 3-6 nm. The sacrificial spacer 130 may be formed by a nitride-based material or an oxide-based material. For example, any of the material examples mentioned in connection with the gate spacers 26 may be used for the sacrificial spacer 130. Advantageously, the sacrificial spacer material may be different from the gate spacer material and inner spacer material. As shown in FIG. 8, a conformal sacrificial spacer layer 30 may be deposited to cover the fin structure 10 and the fin cut mask 20. The sacrificial spacer layer 30 may for instance be deposited by ALD. The sacrificial spacer 130 may then be defined by etching the sacrificial spacer layer 30 using an anisotropic vertical etch such that sacrificial spacer layer portions are removed from horizontally oriented surfaces and are preserved on vertically oriented surfaces to form the sacrificial spacer 130.

Figure 10:
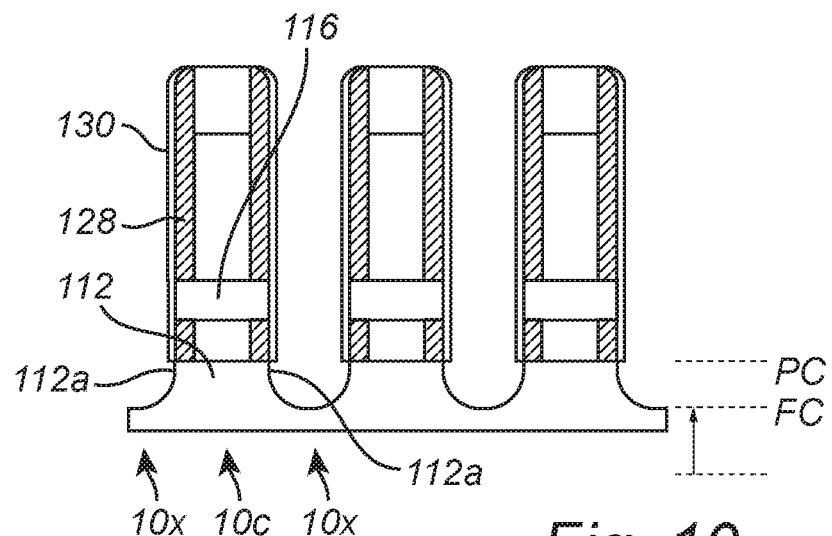

In FIG. 10, final fin cuts have been formed in the fin structure 10 to form a finally cut or finally recessed fin structure. The final fin cuts have been formed by further etching through the fin structure 10 in the fin cut regions 10x while using the fin cut mask/the dummy gate structures 20 as an etch mask. The further etching extends into the lower layer 12 in the fin cut regions 10x to define a lower channel layer portion 112 in the channel region 10c. The further etching deepens the fin cuts to the final fin cut level FC. The further etching may extend completely through the lower channel layer 12 or to a desired level within the lower channel layer 12. During the further etching, the sacrificial spacer 130 covers the vertically oriented end surfaces of the upper fin parts exposed in the fin cut regions 10x.

After forming the final fin cuts, the fin structure 10 includes a number discontinuous fin parts, each including a lower fin part (disposed below the preliminary cut level PC) and an upper fin part (disposed above the preliminary cut level PC). The fin parts are disposed in the channel regions 10c and are separated by cuts or gaps in the fin cut portions 10x. The vertically oriented end surfaces of the upper fin parts, which include the end surfaces 116a, are covered by the sacrificial spacer 130. The vertically oriented end surfaces of the lower fin parts include vertically oriented end surfaces 112a of a lower channel layer portion 112 remaining in each respective channel region 10c. Each lower channel layer portion 112 presents a pair of vertically oriented end surfaces 112a, disposed on opposite sides of the respective channel region 10c. The end surfaces 112a of each lower channel layer portion 112 are formed by the further etching. The end surfaces 112 are exposed in/face a respective cut region 10x. In FIG. 10, the end surfaces 112a (at the bottom portions of the cuts) are illustrated with a slightly rounded shape but this is merely an example and it may also be possible to obtain a more angular shaped bottom portions, e.g., by using an etch with a greater degree of vertical anisotropy.

Figure 11:
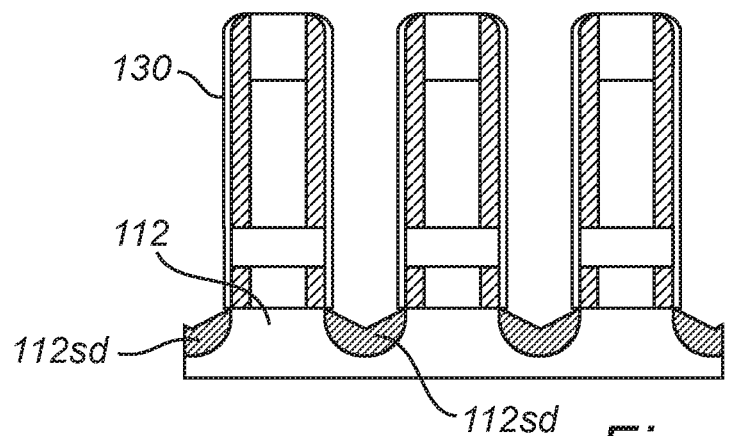

In FIG. 11, epitaxial lower source/drain regions 112sd have been formed in the fin cut regions 10x. The lower source/drain regions 112sd are epitaxially grown on the end surfaces 112a of the lower channel layer portions 112 exposed in the fin cut regions 10x. Source/drain regions in the form of protrusions may thus be formed on the end surfaces 112a.

During the epitaxy of the lower source/drain regions 112sd, the sacrificial spacer 130 covers the end surfaces 116a of the upper channel layer portion 116 and thus counteracts epitaxial growth on the end surfaces 116a of the upper channel layer portions 116. The lateral/sidewall surfaces and upper surfaces of each fin part are covered by a respective dummy gate structure 20. The end surfaces 114a of the intermediate layer portions 114 may be covered by the inner spacer 62, as well as by the sacrificial spacer 130.

For instance, Si or SiGe selective area epitaxy may be performed on the end surfaces 112a, in accordance with the material of the lower channel layer 12. The lower source/drain regions 112sd may be doped in accordance with the desired conductivity type, for instance through in-situ doping as per se is known in the art. Alternatively or additionally, implantation doping or diffusion doping may also be employed. In FIG. 11, the lower source/drain regions 112sd are indicated in a highly schematic manner and may in practice present a geometry dependent on the orientation of the growth surfaces provided by the end surfaces 112a of the lower channel layer portions 112. As indicated in FIG. 11, the epitaxy may be performed such that the lower source/drain regions 112sd merge with source/drain regions grown on lower channel end surfaces 112a on the opposite side of the fin cut region 10x. This may however be varied as desired, for instance depending on end-to-end spacing between adjacent fin parts.

The source/drain epitaxy may be preceded by a "pre-epi clean" comprising an oxide etch such that the lower channel layer portion end surfaces 112a are cleaned from oxide, for instance using an HF-etch or buffered HF-etch.

Subsequent to forming the lower source/drain regions 112sd, the sacrificial spacer 130 may be removed. The sacrificial spacer 130 may for instance be removed using a nitride etch or an oxide etch, as appropriate. The method may further include forming lower source/drain contacts 40 for the lower source/drain regions 112sd, as shown in FIG. 13.

A lower source/drain contact 40 may be formed on and in contact with each lower source/drain region 112sd. The lower source/drain contacts 40 may be formed by depositing one or more conductive materials on the lower source/drain regions 112sd. For instance, a metal such as Ti, TiN, WN, or an alloy of two or more thereof, may be deposited by ALD, CVD or physical vapor deposition (PVD). Optionally, a further material of for instance W, Co, Ni, Ru or an alloy of two or more thereof, may be also deposited as a fill material. The deposited conductive materials may subsequently be etched back and/or patterned to define contacts with the desired dimensions.

Moreover, an insulating capping layer 41 may be formed on a lower source/drain contact 40 in at least one of the fin cut regions 10x. The capping layer 41 may for instance be formed by an oxide (such as $SiO_2$), a nitride-based material (such as SiN) or some other low-k dielectric material. An insulating capping layer 41 may serve to define electrically separate lower and upper source/drain contacts. For instance, for a CMOS-inverter the n- and p-type FETs have inner electrically common drains but electrically separate sources (e.g., connected to a pull-up and pull-down rail respectively). An insulating capping layer 41 may accordingly be formed at the side of the semiconductor structures which is to serve as the output node of the inverter. The capping layer 41 may be formed by depositing capping layer material in the fin cut regions 10x and then etching back the deposited capping layer material to a desired thickness within the fin cut regions 10x. The deposited capping layer material may be completely etched back/removed to expose lower source/drain contacts 40 in fin cut regions 10x where electrically separated lower and upper source/drain contacts are not desired.

Figure 12:
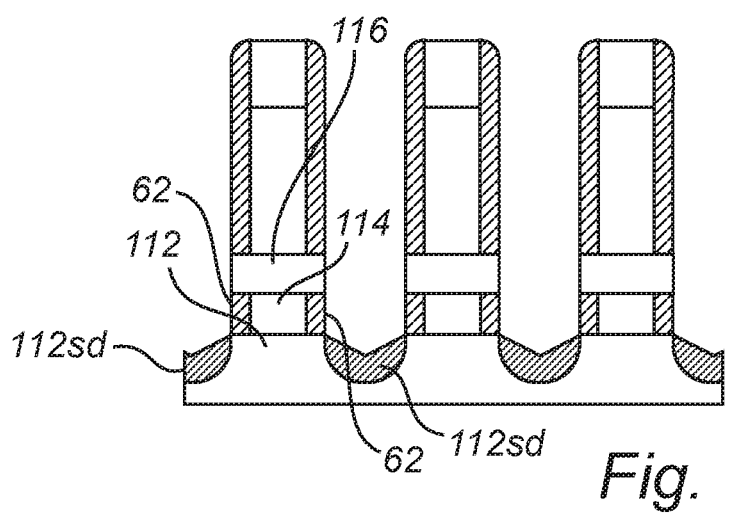
Figure 13:
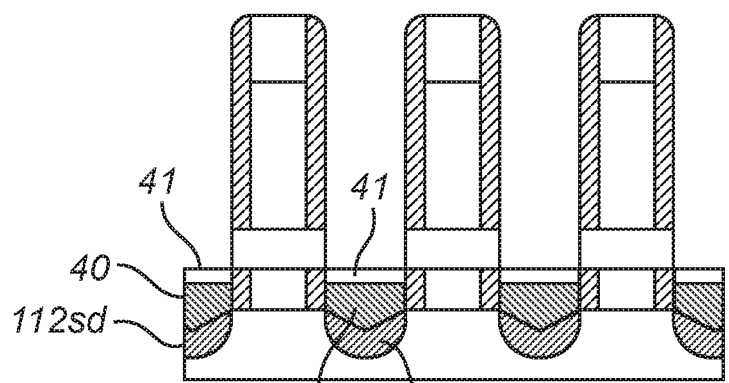

According to an alternative to the processing depicted in FIGS. 12 and 13, the sacrificial spacer 130 may not be removed until after the lower source/drain contacts 40 (and if applicable the capping layer 41) has been formed.

Figure 14:
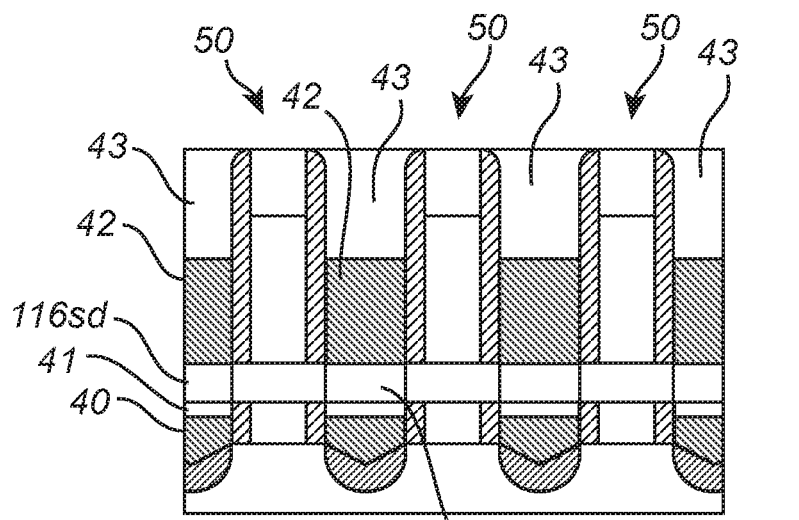

With reference to FIG. 14, following formation of lower source/drain contacts 40 and the insulating capping layer 41, upper source/drain regions 116sd are formed in the fin cut regions 10x. The upper source/drain regions 116sd are epitaxially grown on the end surfaces 116a of the upper channel layer portions 116 exposed in the fin cut regions 10x. Source/drain regions in the form of protrusions may thus be formed on the end surfaces 116a.

During the epitaxial process, the lower source/drain regions 112sd may be covered by lower source/drain contacts 40, ILD and/or any insulating capping layer 41. The lateral/sidewall surfaces and upper surfaces of each fin part are covered by a respective dummy gate structure 20.

For instance, Si or SiGe selective area epitaxy may be performed on the end surfaces 116a, in accordance with the material of the upper channel layer 16. Similar to the lower source/drain regions 112sd, the upper source/drain regions 116sd may be doped (e.g., in-situ doped and/or through ion implantation or diffusion) in accordance with the desired conductivity type, e.g., complementary to that of the lower source/drain regions. The epitaxy may be performed such that the upper source/drain regions 116sd either remain separate from, or merge with, source/drain regions grown on upper channel end surfaces on the opposite side of the fin cut region 10x.

The source/drain epitaxy may be preceded by a "pre-epi clean" comprising an oxide etch such that the upper channel layer portion end surfaces 116a are cleaned from oxide.

As further shown in FIG. 14, upper source/drain contacts 42 for the upper source/drain regions 116sd may be formed. An upper source/drain contact 42 may be formed on and in contact with each upper source/drain region 116sd. The upper source/drain contacts 42 may be formed in a manner analogous to the lower source/drain contacts 40, e.g., by depositing one or more conductive materials and etching back the deposited conductive material to define contacts of a desired height. An ILD may be deposited in the fin cut regions 10x, above the lower source/drain contacts 40sd and where present above the insulating capping layer 41. Contact trenches exposing the upper source/drain regions 116sd may be patterned in the ILD in the fin cut regions 10x. The conductive material may then be deposited in the contact trenches on the exposed upper source/drain regions 116sd and subsequently be etched back (possibly preceded by CMP) to form upper source/drain contacts 42 of a desired height/thickness above the upper source/drain regions 116sd. Following upper source/drain contact formation, an upper insulating layer 43 may be formed on the upper source/drain contacts 42. The upper insulating layer may include an oxide such as $SiO_2$ or some other low-k material. The upper insulating layer 43 may for instance be deposited by CVD and then subjected to CMP to make the upper surfaces of the insulating layer 43 and gate structures 50 flush.

According to an alternative contact-formation scheme, the lower source/drain regions 112sd may (e.g., subsequent to removal of the sacrificial spacer 130) be covered by an ILD or some other temporary material. The lower source/drain regions 112sd may thereby be masked during the formation of the upper source/drain regions 116sd. The temporary material may thereafter be removed wherein the method may proceed with lower source/drain contact formation by: depositing ILD in the source/drain trenches; patterning contact trenches in the deposited ILD exposing the lower source/drain regions 112sd; depositing conductive material on the lower source/drain regions 112sd; and removing any conductive material deposited on the upper source/drain regions 116sd by etching back the conductive material within the contact trenches. An insulating capping layer 41 may subsequently be formed on one or more lower source/drain contacts 40. The method may then proceed with upper source/drain contact formation as set out above.

Figure 15:
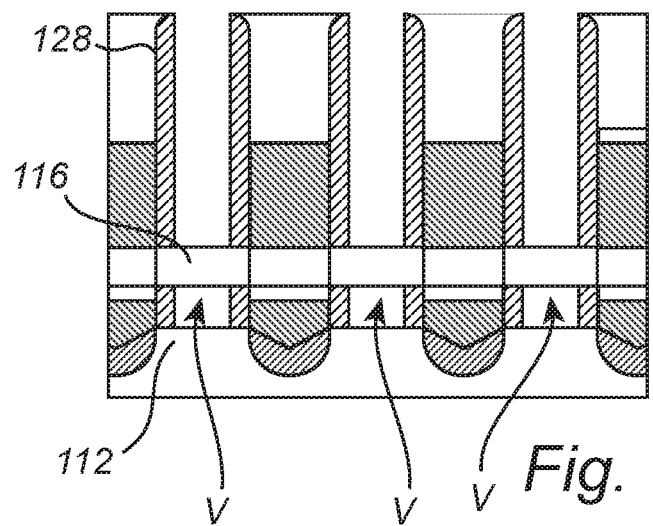

In FIG. 15, the dummy gates 22 have been removed in the channel regions 10c, thereby forming voids or spaces "V" between the lower and upper channel layer portions 112, 116. The lateral/sidewall surfaces of the intermediate layer portions in the channel regions 10c are thereby exposed. The gate caps 24 may be opened to expose the upper surfaces of the dummy gates 22, followed by a dummy gate material etch. Subsequently, any dummy dielectric portions exposed following the dummy gate removal may be removed in an appropriately selected dielectric etch. As shown in FIG. 15, the gate spacers 128 may be preserved.

Following removal of the dummy gates 22 (and dummy dielectric), the lower and upper channel layer portions 112, 116 may be released by removing the intermediate layer portions 114 from the respective fin parts by etching the intermediate layer material selectively to the lower and upper channel layer materials. Accordingly, following the removal of the intermediate layer portions 114, the upper channel layer portions 116 become suspended above the lower channel layer portions 112.

Either wet or dry etching chemistries may be used. For instance, a hydrochloric acid (HCl)-based vapor etch may be used. By way of example, an intermediate layer 14 with greater Ge-content than the lower and upper channel layer portions 112, 116 enables HCl etching of the intermediate layer portions 114 at a rate which is greater than the lower and upper channel layer portions 112, 116. A 10% greater Ge-content of the intermediate layer 114 may enable an intermediate layer etch rate which is at least an order of magnitude greater than that of the upper and lower upper channel layer portions 112, 116.

Figure 16:
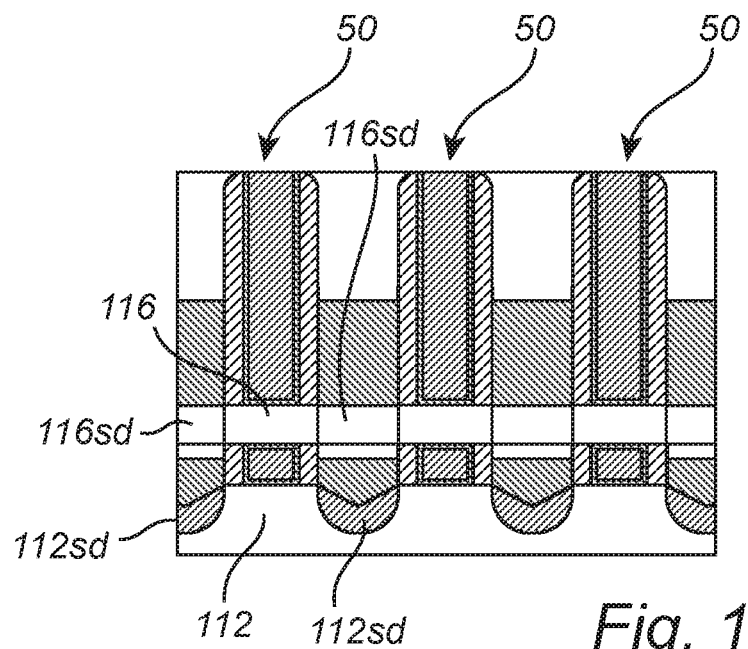
Figure 17:
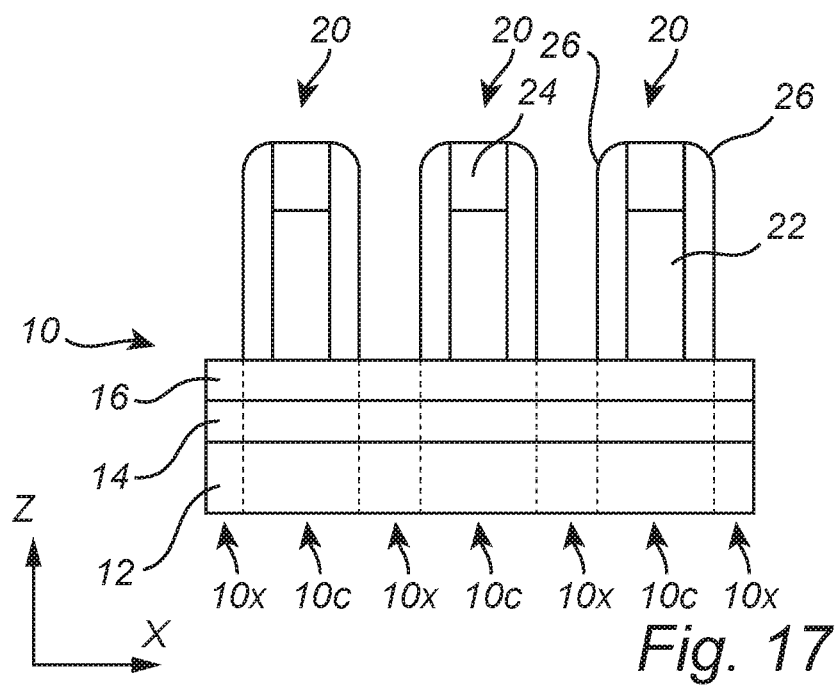
FIGS. 17-22 schematically illustrate a variation of a method for forming a semiconductor device.
Figure 18:
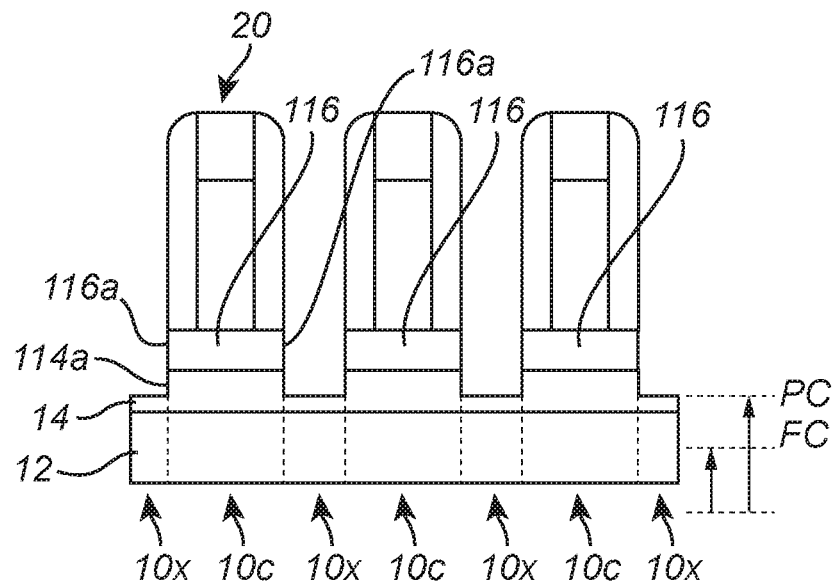
Figure 19:
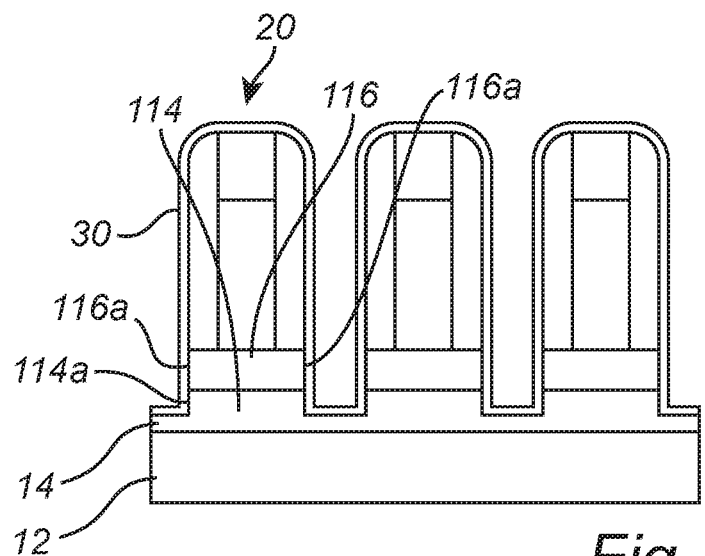

In FIG. 16, the dummy gate structures 20 have been replaced with a respective RMG structure 50. Each RMG structure 50 may comprise a gate electrode and a gate dielectric. The gate electrode may be formed of one or more metals such as TiN, TaN, TiTaN, Al, TiAl, TiC, TiAlC, or suitable combinations or stacks thereof. The metals may be deposited for instance by ALD or CVD. The gate dielectric may be formed by one or more high-k dielectrics such as $HfO_2$, $ZrO_2$, $Al_2O_3$, to name a few. The gate dielectric may be deposited by ALD. The RMG structures 50 (and the gate electrode thereof) may wrap-around respective upper channel layer portions 116.

Accordingly, the semiconductor device shown in FIG. 16 may comprise a lower FET transistor including a lower channel layer portion 112 extending between lower source/drain regions 112sd and an upper GAA FET transistor comprising an upper channel layer portion 116 extending between upper source/drain regions 116sd. The lower and upper FETs include a common gate structure 50 including a gate electrode circumferentially enclosing the lower channel layer portion 112 (at least partially) and circumferentially enclosing the upper channel layer portion 116 completely. The semiconductor device may subsequently be subjected to further processing, such as back-end-of-line (BEOL) processing, to integrate the transistor stacks in a functioning circuit.

Depending on a relationship between the width of the initial fin structure 10 and the length of the fin parts along the horizontal direction X (corresponding to the "gate length" of each dummy gate structure 20), the lower and upper transistors may form either nanowire-channel transistors/FETs or nanosheet-channel transistors/FETs.

Although the above method involves forming of a RMG structure comprising an electrically common gate electrode for the lower and upper channel portions, the method is also applicable for a device structure where the RMG structure comprises electrically separate lower and upper gate electrodes, insulated from each other for instance by an intermediate insulating layer.

With reference to FIGS. 17-22 a further method for forming a semiconductor device will now be described. The method also involves forming of a sacrificial spacer 130 however does not include the method steps of forming the inner spacers 62. After forming the preliminary fin cuts, the method proceeds with forming the sacrificial spacer 130. The sacrificial spacer 130 is formed in a same manner as described in connection with FIGS. 4-5, namely by depositing a conformal sacrificial spacer layer 30 to cover the partially cut fin structure 10 and the dummy gate structures 20. Subsequently, the sacrificial spacer 130 may be defined by etching the sacrificial spacer layer 30 using an anisotropic vertical etch such that sacrificial spacer layer portions are removed from horizontally oriented surfaces and are preserved on vertically oriented surfaces to form the sacrificial spacer 130. In contrast to the preceding method, inner spacers 62 are however not present when the sacrificial spacer layer 30 and the sacrificial spacer 130 are defined.

Figure 20:
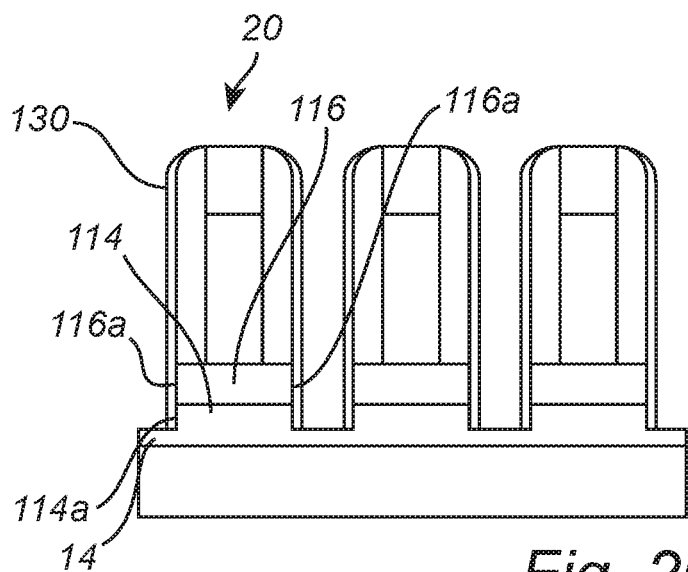
Figure 21:
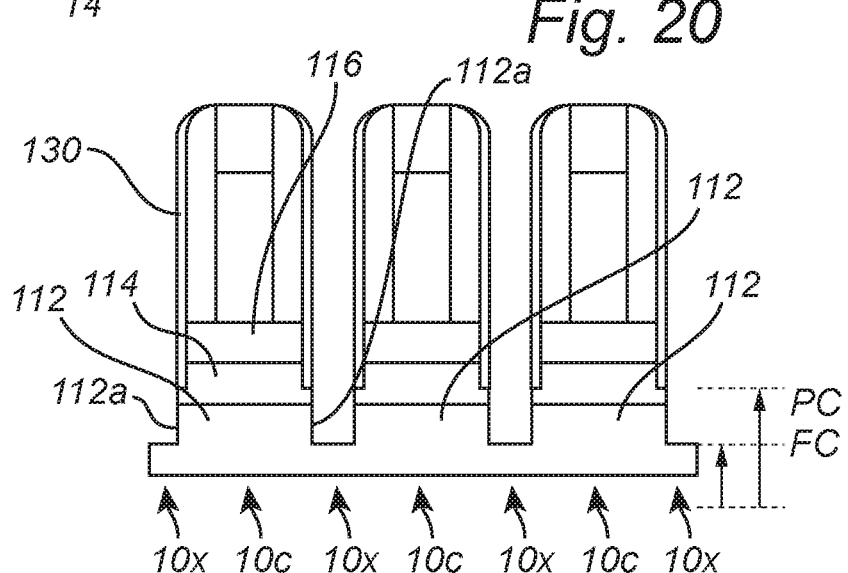
Figure 22:
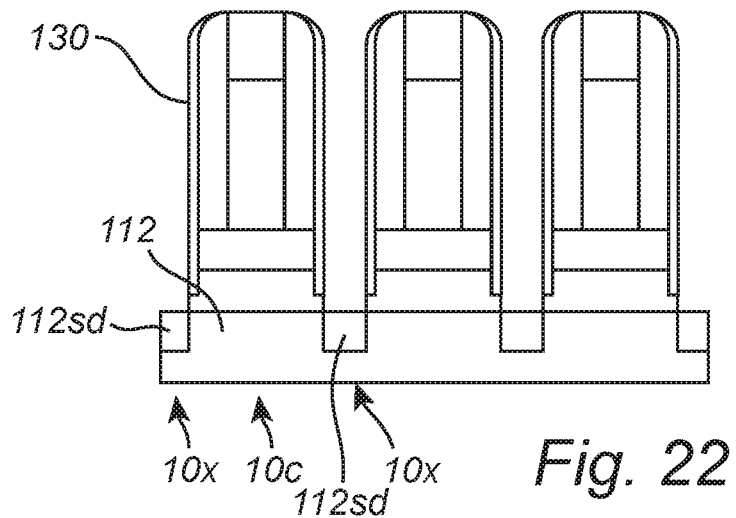

As shown in FIGS. 20-22, the method may then proceed in a same manner as described in connection with FIGS. 10-11, namely by forming final fin cuts by further etching into the lower channel layer 12 to form channel layer portions 112 in each channel region 10x (FIG. 21); and forming epitaxial lower source/drain regions 112sd (FIG. 22). The method may thereafter proceed as described above by sacrificial spacer removal, lower source/drain contact formation, upper source/drain region epitaxy, upper source/drain contact formation, wire release, and eventually RMG structure formation.

In the above the inventive concept has mainly been described with reference to a limited number of examples. However, as is readily appreciated by a person skilled in the art, other examples than the ones disclosed above are equally possible within the scope of the inventive concept, as defined by the appended claims.

For instance, although the layer stack of the above described fin structures 10 comprises three layers, it should be understood that layer stack may comprise a greater number of layers. For instance, the lower channel layer 12 may be supported by an underlying sacrificial layer, for instance formed of a same material as the intermediate layer 14. Thereby, as may be understood from the above, a wrap-around-gate may be formed for both the lower and upper channel layer portions/transistors. Hence, both the lower and upper transistor may be GAA FETs. According to a further variation, a layer stack of a fin structure may comprise a first semiconductor channel layer (e.g., of Si or SiGe), an intermediate insulating layer (e.g., SiO$_2$) and a second semiconductor channel layer (e.g., of Si or SiGe). In this case, wire release of the intermediate layer may be skipped, wherein the gate may be formed to wrap around neither the first nor the second channel layers. According to a further variation, a layer stack of a fin structure may comprise a repetitive sequence of a sacrificial layer and a channel layer, wherein a sacrificial spacer may be formed to cover end surfaces of a number (upper) channel layer portions in an upper part of the fin structure while exposing end surfaces of a number of (lower) channel layer portions in a lower part of the fin structure. Thereby, each of the (lower) channel layer portion end surfaces exposed by the sacrificial spacer may be provided with (lower) source/drain regions (e.g., of a first conductivity type n or p). Following removal of the sacrificial spacer, each of the (upper) channel layer portions end surfaces previously covered by the sacrificial spacer may be provided with (upper) source/drain regions (e.g., of a second complementary conductivity type p or n).

What is claimed is:

1. A method of forming a semiconductor device, the method comprising:
   forming a fin cut mask over a semiconductor fin structure extending horizontally over a substrate, the semiconductor fin structure comprising lower and upper channel layers separated by an intermediate layer, wherein the fin cut mask covers the semiconductor fin structure in a channel region and exposes the semiconductor fin structure in fin cut regions on opposite sides of the channel region;
   forming preliminary fin cuts in the semiconductor fin structure by partially etching through the semiconductor fin structure in the fin cut regions, wherein partially etching extends the preliminary fin cuts through the upper channel layer in the fin cut regions to define an upper channel layer portion in the channel region;
   forming a sacrificial spacer covering end surfaces of the upper channel layer portion which are exposed in the fin cut regions on opposing sides of the channel region;
   forming final fin cuts in the semiconductor fin structure by further etching through the semiconductor fin structure in the fin cut regions, wherein further etching extends the final fin cuts into the lower channel layer in the fin cut regions to define a lower channel layer portion in the channel region;
   forming epitaxial lower source/drain regions on end surfaces of the lower channel layer portion which are exposed in the fin cut regions on the opposing sides of the channel region;
   removing the sacrificial spacer, thereby exposing the end surfaces of the upper channel layer portion; and
   forming epitaxial upper source/drain regions on the end surfaces of the upper channel layer portion.

2. The method of claim 1, wherein partially etching through the semiconductor fin structure extends the preliminary fin cuts completely through the upper channel layer and into the intermediate layer and is stopped at or above the lower channel layer without etching into the lower channel layer.

3. The method of claim 1, wherein partially etching through the semiconductor fin structure extends the preliminary fin cuts partially through the intermediate layer such that the lower channel layer is covered by a portion of the intermediate layer remaining in the fin cut regions.

4. The method of claim 1, further comprising:
   forming recesses in the semiconductor fin structure between the upper channel layer portion and the lower channel layer using an intermediate layer material selective etch subsequent to forming the preliminary fin cuts and prior to forming the sacrificial spacer, wherein the recesses are located on the opposing sides of the channel region; and
   depositing inner spacers in the recesses.

5. The method of claim 1, wherein the sacrificial spacer is formed to further cover end surfaces of an intermediate channel layer portion defined by partially etching through the semiconductor fin structure and wherein the end surfaces are exposed in the fin cut regions on the opposing sides of the channel region.

6. The method of claim 5, wherein further etching through the semiconductor fin structure comprises etching through the intermediate layer remaining in the fin cut regions and into the lower channel layer.

7. The method of claim 1, wherein forming the sacrificial spacer comprises:
- depositing a conformal sacrificial spacer layer that covers the semiconductor fin structure and the fin cut mask; and
- etching the sacrificial spacer layer using an anisotropic vertical etch such that sacrificial spacer layer portions on horizontally oriented surfaces are removed and sacrificial layer portions on vertically oriented surfaces remain.

8. The method of claim 1, wherein the fin cut mask comprises a plurality of mask portions, each extending across the semiconductor fin structure in a respective channel region and exposing fin cut regions on opposing sides of the respective channel region and wherein forming a plurality of preliminary fin cuts comprises partially etching through the semiconductor fin structure in each of the fin cut regions exposed by the fin cut mask.

9. The method of claim 1, wherein the fin cut mask comprises a sacrificial gate structure extending across the semiconductor fin structure in the channel region.

10. The method of claim 9, further comprising, subsequent to forming the lower and upper source and drain regions, replacing the sacrificial gate structure with a replacement metal gate structure.

11. The method of claim 10, further comprising removing the intermediate layer from the channel region using an intermediate layer material selective etch subsequent to removing the sacrificial gate structure, and thereafter forming the replacement metal gate structure.

12. The method of claim 1, further comprising forming lower source and drain contacts in the fin cut regions for the lower source and drain regions and forming upper source and drain contacts for the upper source and drain regions.

13. The method of claim 12, wherein the lower source and drain contacts and the upper source and drain contacts are vertically separated by an insulator.

14. The method of claim 1, wherein the lower channel layer portion and the lower source and drain regions form part of a lower transistor and wherein the upper channel layer and the upper source and drain regions form part of an upper transistor.

15. The method of claim 1, wherein the sacrificial spacer is formed after forming the preliminary fin cuts but before forming the final fin cuts.

16. The method of claim 1, wherein each of the lower and upper channel layers and the intermediate layer comprises one or both of silicon (Si) and germanium (Ge).

17. The method of claim 16, wherein each of the lower and upper channel layers and the intermediate layer comprises a SiGe alloy, and wherein the intermediate layer has a Ge content that is higher or lower than Ge contents of the lower and upper channel layers.

18. The method of claim 16, wherein the lower and upper channel layers comprise SiGe alloys having different Ge contents.

* * * * *